United States Patent
Holzmann

Patent Number: 6,158,650
Date of Patent: Dec. 12, 2000

[54] PROCESS FOR FINE AND COARSE PITCH SOLDER DEPOSITS ON PRINTED CIRCUIT BOARDS

[75] Inventor: Andrew Vincent Holzmann, Coto De Caza, Calif.

[73] Assignee: Mask Technology, Inc., Santa Ana, Calif.

[21] Appl. No.: 09/409,925

[22] Filed: Sep. 30, 1999

Related U.S. Application Data

[62] Division of application No. 08/897,211, Jul. 9, 1997, Pat. No. 5,984,166.

[51] Int. Cl.⁷ .............................. B23K 31/02; B23K 35/14
[52] U.S. Cl. ........................................ 228/248.1; 228/254
[58] Field of Search .................................... 228/254, 246, 228/248.1, 224, 56.3; 427/96, 282; 118/504, 505, 213, 301, 406

[56] References Cited

U.S. PATENT DOCUMENTS

| | | | |
|---|---|---|---|
| 5,046,415 | 9/1991 | Oates | 101/128.21 |
| 5,155,895 | 10/1992 | Jakiela et al. | 29/453 |
| 5,395,040 | 3/1995 | Holzmann | 228/254 |
| 5,460,316 | 10/1995 | Hefele | 228/39 |
| 5,492,266 | 2/1996 | Hoebener et al. | 228/248.1 |
| 5,505,367 | 4/1996 | Degani et al. | 228/248.1 |
| 5,535,936 | 7/1996 | Chong et al. | 228/175 |
| 5,681,387 | 10/1997 | Schmidt | 118/105 |
| 5,804,248 | 9/1998 | Hewett | 427/96 |
| 5,813,331 | 9/1998 | Tan et al. | 101/129 |
| 5,825,629 | 10/1998 | Hoebener et al. | 361/777 |
| 5,921,462 | 7/1999 | Gordon | 228/191 |
| 5,934,545 | 8/1999 | Gordon | 228/191 |

FOREIGN PATENT DOCUMENTS

WO98/56218   12/1998   WIPO .

*Primary Examiner*—Patrick Ryan
*Assistant Examiner*—Kiley Stoner
*Attorney, Agent, or Firm*—Richard T. Holzmann

[57] ABSTRACT

Methods by which low melting point solder for reflow connection of components is formed on select fine and coarse pitch contacts of a printed circuit board simultaneously. A template with openings to select fine pitch circuit board contacts is placed in contact with fine pitch contacts. The fine and coarse pitch contacts of the board are exposed through holes in a stencil characterized in its ability to withstand solder reflow temperatures, not be wettable by solder, and have a coefficient of thermal expansion relatively matching the printed circuit board. Low temperature solder paste is screen deposited into the stencil openings. The solder paste retained by the template and stencil pattern is shaped during reflow to selectively form on the underlying contacts of the printed circuit board. Thereafter the board is subjected to previously practiced depositions of flux in preparation for fine and coarse pitch component placement and ensuing solder reflow. An alternate practice of the invention involves a method for controlling the volume of solder on select electrically conducting contacts of a substrate. A shaped solder deposit formed by a method which comprises: positioning a template in intimate contact with a substrate for shaping the side wall and height of a solder deposit; depositing solder paste within the confines of said template; heating said deposited solder paste to drive off volatile components and soften solder; and cooling the thus deposited solder to form the shaped solder deposit within said template. The shaped solder deposit formed by the above process.

5 Claims, 3 Drawing Sheets

Process Flow Chart FIG. 5
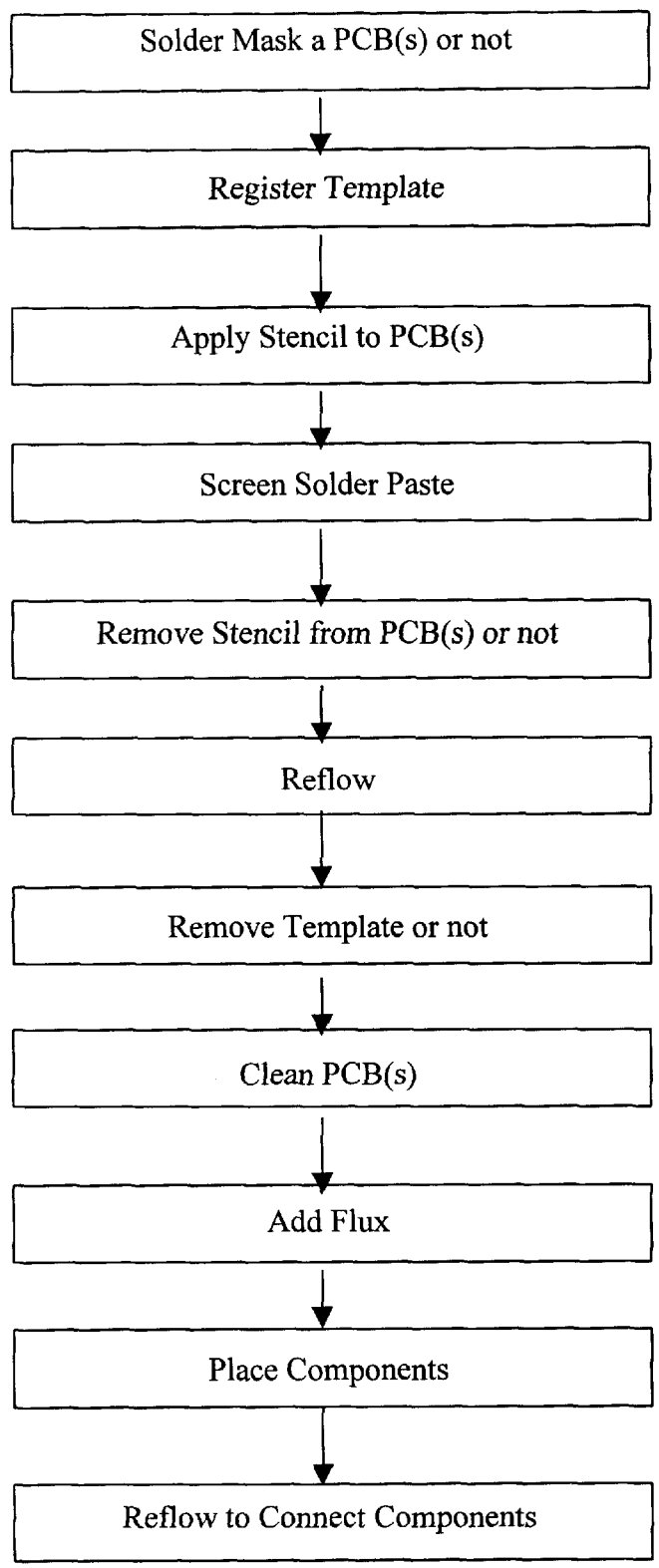

PROCESS FOR FINE AND COARSE PITCH SOLDER DEPOSITS ON PRINTED CIRCUIT BOARDS

This is a division of Ser. No. 08/897,211 filed Jul. 9, 1997 with which it is now U.S. Pat. No. 5,984,166.

FIELD OF INVENTION

The present invention is related in general to depositing and shaping solder deposits, and more particularly, to those deposits on printed circuit boards.

BACKGROUND OF THE INVENTION

Advances in technology in the electronics industry continually drive manufacturers to reduce the size of finished products while increasing their power. This is certainly true with respect to notebook and palmtop computers as well as with cellular telephones and camcorders. Desk top computers today are as powerful as those which occupied an entire room years ago. Telephones now fit in a shirt pocket.

Nevertheless, there are sectors of the industry, for example, in printed circuit board fabrication and in assembly that attach components, such as packaged integrated circuit devices to the board, which have reached their limits using conventional approaches. The two major obstacles being the application of solder mask between surface mount pads and the printing of solder paste on those pads.

Typically, a printed circuit board having thereon both fine and coarse pitch copper contact patterns is coated with a permanent solder mask whose purpose is to allow soldering only to the exposed copper patterns. In many cases, it is desirable to image a solder mask dam or web at sites between surface mount lands to act as an isolating barrier during subsequent solder paste printing and reflow. This dam or web prevents shorts from forming. The solder mask must be thick enough to provide a well into which an adequate volume of solder paste can be deposited by screen printing for subsequent reflow.

On coarse pitch products, about 0.016" (16 mil) or higher, this does not present a problem as the application and imaging of the solder mask is relatively easy. There is a sufficient gap between lands on the board to enable resolution of this web. When the pitch becomes finer, it becomes increasingly difficult to align (register) and develop these features. In many cases this obstacle is insurmountable using conventional technology and different approaches need to be used.

The basic processes involved in attaching surface mount components to a printed circuit board consist of the following: 1. Paste Printing; 2. Component Placement; and 3. Solder Reflow. The largest number of defects associated with this process, approximately 70%, are directy attributable to the printing of solder paste. For this as well as other reasons, several processes have recently been developed which apply a sufficient amount of solder to the board prior to the assembly stage which significantly simplifies the process and reduces the associated defects. However, processes such as Precision Pad Technology (PPT®), Optipad®, and Sipad® all require a solder mask dam or web between the lands for fine pitch applications in order to isolate the features and contain the solder.

Surface mount technology (SMT) is now routinely used to attach packaged integrated circuit devices to printed circuit boards. In one form, the practice involves the use of solder paste selectively deposited onto copper contacts of the printed circuit board through a stencil patterned with openings corresponding to the board contact locations. The solder paste is screen deposited in patterns on the printed circuit boards using the stencil and a doctor blade to squeegee the solder paste through the holes in the stencil. When the stencil is removed, the solder paste remains on the printed circuit board contacts.

Since the solder paste is typically 50% flux by volume, with the other 50% being particles of solder, the paste is also used to hold the component terminals in place during the solder reflow step which follows. The eutectic low melting point solder (63% tin, 37% lead-63/37) normally used permits reflow and concurrent bonding of the component terminals to the printed circuit board contacts at a temperature below 250 deg. C. compatible with the glass transition capabilities of flame retardent level 4 (FR4) printed circuit board materials.

The spacing of the leads for packaged integrated circuit components typically exhibit a pitch no finer than 16 mils. This capability is consistent with conventional SMT processes using screen deposited solder paste to hold and connect packaged integrated circuit devices to printed circuit boards.

Photolithographic processes used to form conductive contact patterns on modern printed circuit boards have the capability to create correspondingly fine pitch patterns. Unfortunately, attempts to screen solder paste in the fine pitch patterns characterizing the more advanced packaged integrated circuit devices in the neighborhood of 10 mil pitch have been frustrated by solder mask/solder paste problems.

In the absence of an effective solder paste screening process for depositing solder onto fine pitch printed circuit board contacts, other techniques have been employed. One approach uses masking and electroplating to deposit the solder. This process includes the formation of a photolithographically defined mask, an electroplate bath deposition of low melting solder on printed circuit board contacts not covered by the mask, a removal of the mask, and a reflow of the electroplated solder. The process involves numerous steps and has associated high cost.

Another approach involves the injection of molten solder through a dispensing head with a mask corresponding to the copper contact pattern of the printed circuit board. Unfortunately, the molten solder dispensing head is very expensive, requires a distinct mask for each different device footprint, and dispenses the solder to the contacts of only one die location at a time. An additional approach which reportedly has been used involves coating the entire board with molten solder thereby filling the wells and then blowing off the solder remaining on the solder mask. Of course, subjecting an entire board to the temperature and aggressiveness of molten solder is not an optimum solution to these problems.

The PPT® process has resulted in several U.S. patents being granted to Holzmann with the following U.S. Pat. Nos. 5,310,574; 5,395,040; and 5,403,671; as well as European Patent No. EP 0 640 271 B1 which contains essentially all significant features of the three prior U.S. patents. These patents teach the use of a mesh pressed against the circuit board with subsequent reflow whereby the mesh insures filling the well and shaping the formed solder with an imprint of the mesh on its top. Furthermore, the mesh forces excess solder, including solder balls, onto the upper surface thereof, thereby eliminating the possibility of short circuits caused by the excess solder . . . all the wells are filled. This excess is easily removed from the mesh. The other two processes, i.e., Optipad® and Sipad®, flatten the top surface of the solder deposit. All three of these processes suffer from the need for a solder mask for fine pitch applications, which mask has severe resolution problems when defining a fine pitch well for deposition of solder.

Other relevant prior art can be found in U.S. Pat. No. 5,492,266 granted to Hoebener wherein is disclosed a method and product for fine pitch solder deposits using a stencil to screen the solder paste leaving the stencil on the board on top of the solder mask during a reflow step. This method is suited to the fabrication of populated printed circuit boards having fine pitch devices including flip-chip devices, connected on a board including conventional coarse pitch surface mount components.

As Hoebener points out in his patent, however, there are several weaknesses in this method. For example, it is stated that, "Tests to date have confirmed that the shape of the hole has an effect on the volume and formation consistency of the low melting point solder deposited onto contact 2. However, the optimum shape has yet to be defined, and is likely to be related to the material used for the stencil, the thickness of the stencil, the size of the contact, and the composition and rheology of the solder paste." (emphasis added)

Furthermore, "The use of a common stencil for both the fine and coarse pitch contacts may result in less than normal solder volume for the coarse pitch contacts. However, it is anticipated that any such variations or problems can be overcome through process optimization."

In addition, "The solder formed on the coarse pitch contacts may not have to be flattened in preparation for component placement." This flattening requirement itself can be a substantial problem since it involves additional equipment and time, and runs the risk of producing a squeeze-out of excess solder, which solder can produce short circuits, and the need to clean this excess off.

Another alternative, ". . . involves the practice of the invention in which the stencil is not removed following reflow of the solder paste. This practice will likely involve the screening of paste for both fine and coarse pitch contacts using the common stencil, and the use of the flux to hold the components during final reflow step 36 . . . " One final point is that in the Hoebener method, solder mask is a requirement.

One relevant disclosure appeared in *Electronic Packaging & Production*, May '97, in an article entitled, "Forming BGAs with Solder Paste", Brutovsky, et al, of IBM, pp. 57–61, wherein a top and bottom stencil are employed. The authors point out that existing paste stenciling operations produce highly repeatable solder volumes at high throughput rates. Also, solder purchased in paste form is much less expensive than that purchased as discrete balls of tightly controlled size conventionally used in BGA (ball grid assembly). Paste volume is a function of stencil thickness and aperture size. Stencil thickness is the key variable for controlling paste volume and resulting BGA ball size.

To avoid the problem of solder paste sticking to the aperture walls and pulling away from the laminate, these inventors use two different stencils. Their top stencil being fixed in an SMT screen printer is removed after screening, whereas their bottom stencil, made of magnetic steel with chrome plating, stays with the laminate through the solder paste reflow operation and is only removed thereafter. A special workholding fixture having magnets embedded therein holds the bottom stencil firmly in place against the PCB laminate.

Due to the size of this "sandwich", early designs were too massive to be heated adequately in existing reflow ovens; therefore, to reduce thermal mass, a window-frame-like design with special cutouts was used. The stenciling and reflow operation provide a consistent volume of solder to each BGA pad.

Since this method of depositing solder results in consistent solder volumes, it is less desirable when shaping solder deposits simultaneously on fine and coarse pitch contacts which require the deposit of variable solder volumes. Where varying volumes are necessary, the instant invention solves this problem as well, without the use of reflow ovens, and without the need for complex magnetic fixtures and stencils which appear to be suitable only for very high volume production.

In the context of this known technology, there is therefore, the object of the instant invention to satisfy the need for a process, and product formed thereby, which will deposit and shape solder on a fine pitch printed circuit board contact pattern within the framework of conventional screened solder paste deposition processes while providing solder volumes on both coarse and fine pitch contacts simultaneously adequate to connect conventional surface mount devices and other packaged integrated circuit device components.

It is a further object to do the above without the use of a solder mask.

It is an additional object of the invention to eliminate the registration problems.

It is yet another object to reduce the number of processing steps and the need for specialized equipment.

Other objects will emerge from a study of what follows.

SUMMARY OF THE INVENTION

According to the teaching of the present invention, a method of forming fine and coarse pitch solder deposits simultaneously on a circuit board comprising the steps of: registering a template with openings aligned to select circuit board fine pitch contacts; positioning a stencil over the circuit board with openings aligned to select circuit board fine and coarse pitch contacts; screen depositing solder paste into openings of the positioned stencil; reflowing the solder paste while holding the positioned stencil against the circuit board to shape solder on the select circuit board contacts; cooling and releasing the stencil without removing the solder on the select circuit board contacts.

In variations of the basic practice, a plurality of templates may be used and these may be of differing heights to capture varying volumes of solder. These so-called circuit boards may be a conventional circuit board or a hybrid circuit board or even a semiconductor wafer. Furthermore, a plurality of circuit boards on an individual panel may be employed. The method is relatively independent of whether the solder is in the form of paste, cream, powder or solid solder; or whether it is deposited by screen printing, paste stenciling, electroplating, immersion in a molten solder bath or the like.

In another practice of the invention, a method for controlling the volume of solder deposited on select electrically conducting contacts of a substrate comprising the steps of: registering a template having defined open contact pattern areas therein with defined pattern contact areas on the substrate; positioning a stencil having openings aligned to the defined open contact pattern areas of the template in intimate contact with the uppermost surface of the template; screen depositing solder paste into openings of the positioned stencil; removing the stencil from the template; reflowing the solder paste to shape solder on the contacts to connect components thereto; cooling; and removing the template. According to one practice of the invention, the template remains permanently on the substrate while another method comprises a plurality of templates.

Also claimed is a shaped solder deposit formed by a process which comprises: positioning a template in intimate contact with a substrate for shaping the side wall and height of a solder deposit; depositing solder paste within the confines of said template; heating said deposited solder paste to drive off volatile components and soften solder; and cooling the thus deposited solder to form the shaped solder deposit within said template.

These and other features of the invention will be more clearly understood and recognized upon considering the detailed description which follows.

BRIEF DESCRIPTION OF THE DRAWINGS

The above and other objects, features and other advantages of the present invention will be more clearly understood from the following detailed description taken in conjunction with the accompanying drawings, in which:

FIG. 5 is a process flow chart.

DETAILED DESCRIPTION OF THE PREFERRED EMBODIMENTS

Figure 1:
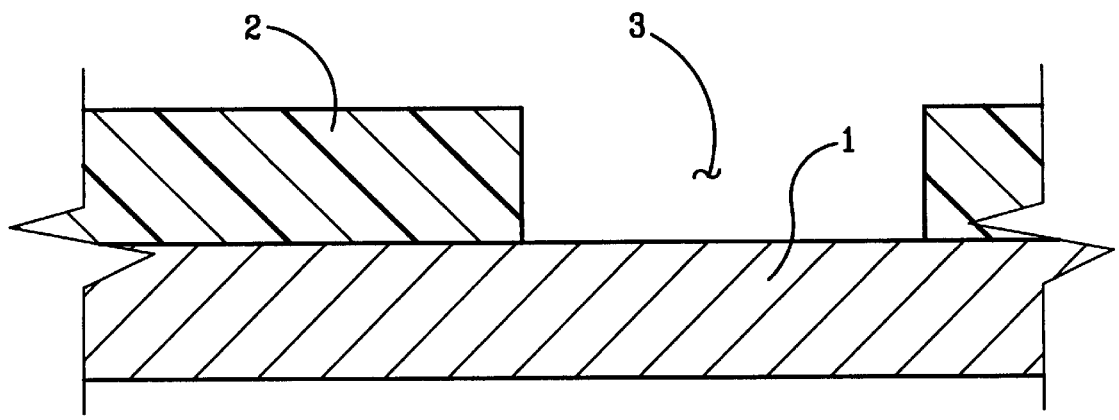
FIG. 1 is a side view of a printed circuit board illustrating the block opening in the solder mask.

The focus of the invention is on the deposition of low melting point solder in controlled and shaped volumes on fine and coarse pitch printed circuit board contacts simultaneously as well as hybrid circuit boards and semiconductor wafers, while maximizing the use of existing equipment and minimizing process steps and complexity.

A stencil can be defined as a thin sheet or plate in which a pattern is cut, through which applied solder paste, in the instant case, penetrates to a surface beneath or the copper contacts thereon, for example, a printed circuit board. A template, on the other hand, serves a number of other purposes. A template is conventionally defined as a guide in shaping something, in this case, the solder during its reflow and formation. Solder mask, however, is a material that protects sites from having solder adhere thereto. Thus, a stencil deposits paste where one wants it; a template shapes paste while it is being deposited and during reflow; and a solder mask protects sites where one does not want paste; . . . totally different structures with totally different functions.

According to one practice of the invention, a template further eliminates the requirement for solder mask to define fine features, for example, in working with tape automated bonding techniques (TAB) which are commonly 0.010 in. (10 mil) pitch and for which there is an insufficient gap between the lands on the board for the solder mask to resolve a web or dam or to develop this feature.

The instant invention uses a template in place of a solder mask in the areas on the circuit board where the pitch is too dense to allow reliable application of solder mask. Rather than attempting to resolve the extremely small features with a solder mask, an opening is provided in the mask in the entire area where the fine pitch component(s) is to be placed. A template(s) with apertures for the surface mount lands is then placed in the openings left in the mask. With the template(s) in position, solder paste is then printed onto the surface mount pads as is done in a conventional process. Once the paste is printed, the template(s) could then either be removed or remain in place depending on the specific application. In most instances it is preferable to leave the template(s) in place until after the solder is reflowed and formed; it may also be desirable in certain instances to leave the template(s) permanently attached to the board.

This invention can also obviate the need for solder mask contingent on board design. Where the template acts as an isolating barrier for fine pitch sites, and where coarse pitch sites do not require an isolating barrier, e.g., where electrical shorts are not an issue, then the use of solder mask can be eliminated.

The template can be made from various materials including stainless steel, plastic or film depending on the desired results and the cost. In other circumstances, coating the device with a Teflon®-like substance will prevent the solder paste from adhering thereto. Where there are usually only a few sites per board requiring templates, a chemically milled or laser etched stainless template can be advantageous. Should the panel require numerous templates, a suitable film treated on one side with adhesive is a preferred technique.

The use of a template instead of a solder mask offers a number of advantages over existing technology. The inherent limitations associated with resolution of fine pitch features are immediately overcome permitting board manufacturers to readily satisfy the latest requirements. Another immediate benefit associated with artwork registration is due to the fact that board manufacturers frequently build printed circuit panels containing numerous printed circuit board cards which are subsequently routed into individual ones. The major shortcoming using solder mask is that instead of registering the film to one or two fine pitch sites on the panel, one must now register to many . . . a difficult operation. Even were the boards and their artwork perfectly matched, film growth and distortions associated with temperature and humidity fluctuations oftentimes prevents the film from precise alignment. It is quite common for a technician to find that half the sites are aligned and the other half are not. In such case it is common practice to cut the film and align the individual pieces to the panel as necessary. The instant invention allows the technician to simply align the solder mask over the entire panel by placing the template in position exposing the open area fine pitch sites as the primary alignment feature. The same solder mask artwork produced by the CAD system is used to produce the template thereby assuring a perfect match.

The present invention avoids the complex plating operations and equipment requirements associated with the prior art deposition of low melting point solder in fine pitch patterns on a printed circuit board. FIGS. 1–4 summarize the key operations in one embodiment of the present invention.

In this practice of the invention, as is done in the prior art, solder mask 2 is applied to a printed circuit board (PCB) 1 having thereon both coarse and fine pitch patterns. The solder mask is then exposed with artwork that has the coarse pitch areas precisely defined and the fine pitch areas only grossly defined leaving an open block section 3. Upon developing the solder mask film 2 along with thermal and ultraviolet treatment thereof, the precisely defined coarse pitch copper lands (not shown) as well as the fine pitch open areas (not shown) are available for solder paste application thereon.

In the open area 3 is placed a template 4 having openings 5 which match the fine pitch fine copper patterns. Template 4 was produced from the same artwork used to prepare both the copper contacts and stencil 6 which is next placed in intimate contact with solder mask 2 and template 4. With stencil 6 aligned to and fixed in location on the upper surface of printed circuit board 1, low melting point solder paste is squeezed into holes of stencil 6 using a doctor blade or other solder paste screening equipment which can obviously be used.

Stencil 6 with template 4 still in place, is subjected to reflow temperature. After reflow and cooling, the board 1 is subjected to the conventional final steps in the process as shown in FIG. 5. Whether template 4 remains permanently on board 1 or is removed depends upon the nature of the component to be subsequently placed and affixed to board 1. Some components prefer a low volume of solder with the rounded meniscus ("bump") of the solder for attachment purposes; others prefer a higher volume of solder with a flattened upper surface; still others require a combination which may require flattening by one or another of prior art techniques. This invention was made to allow its use for a variety of component types as well as for a variety of coarse pitch and fine pitch copper contact areas on a single board or panel of boards. Of course, to maximize utilization of this process a careful selection of materials of construction of the template must be made to conform with the total process requirements. Certainly, non-wettability by solder is a necessary attribute of the template material as is coefficient of thermal expansion and thermal stability as is the case where the template is fabricated from plastic material which may or may not have properties permitting adherance to the board either temporarily or permanently.

FIG. 1 illustrates the first step, the formation of a block opening 3 in solder mask 2 over the fine pitch copper contacts (not shown) on one surface of patterned printed circuit board 1. The fine pitch copper contact is a copper trace on the board, a layer of copper selectively patterned by conventional photolithographic processes. A conventional solder mask 2 is formed by a photolithographic process to cover all but the copper contacts and immediately adjacent printed circuit board surfaces. It should be noted that a plurality of fine pitch contacts may have been formed on a single board or panel of boards, or even coarse pitch contacts as well.

Figure 2:
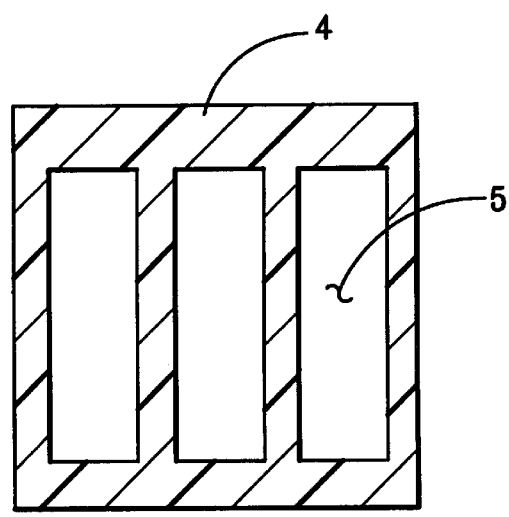
FIG. 2 is a top view of a template having openings corresponding to fine pitch copper contacts therein.

FIG. 2 shows a generalized top view of a template 4 with openings 5 therein conforming to the precise fine pitch copper patterns on the printed circuit board. The material of construction of the template depends upon the particular system requirements but must be non-wettable by solder and be able to withstand subsequent solder reflow temperature. It can be selected, for example, from those materials mentioned above.

Figure 3:
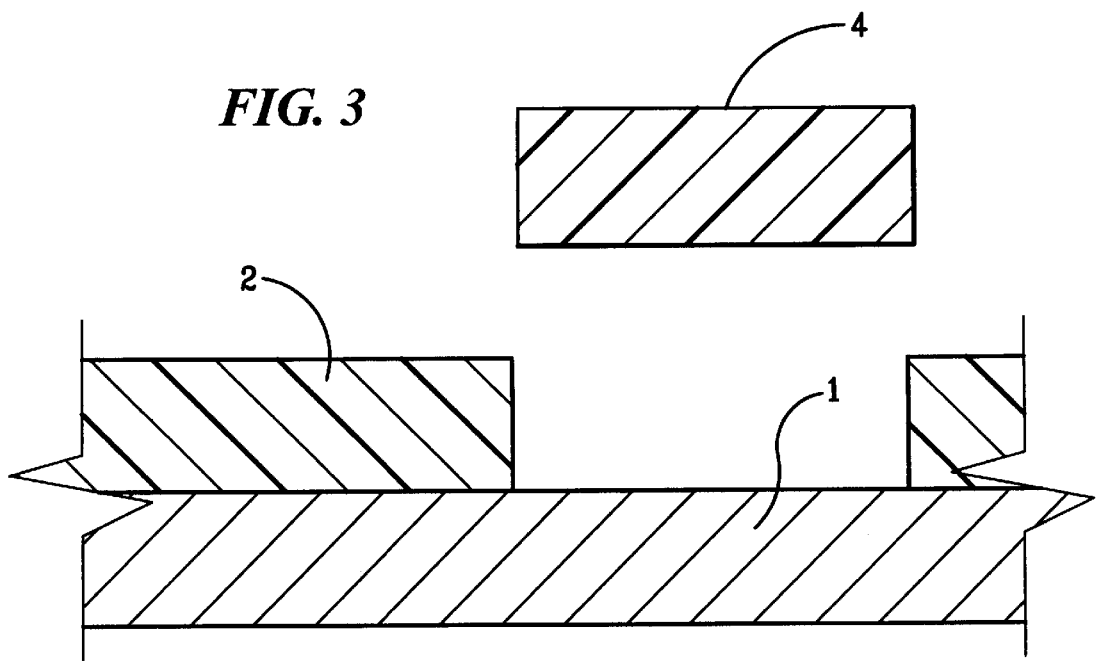
FIG. 3 is a side view of a template in place above the opening in the solder mask.
Figure 4:
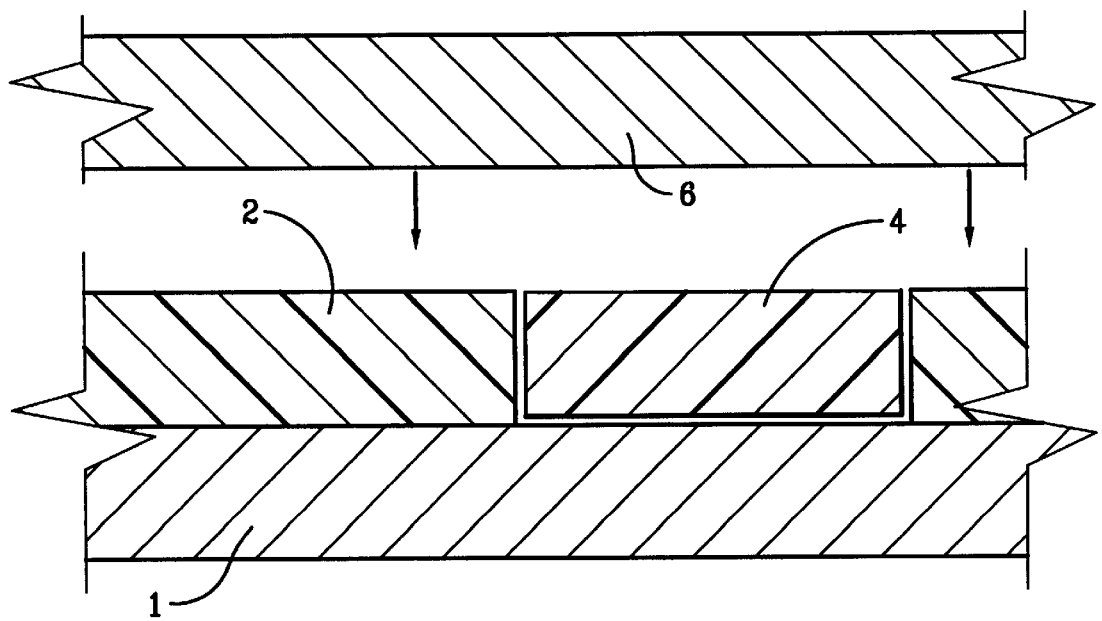
FIG. 4 is a side view of a template in place on a circuit board with a stencil located above.

FIG. 3 illustrates the next step, the placement of template 4 in position above solder mask open area 3 aligned to conform to fine pitch copper contact pattern on printed circuit board 1. FIG. 4 shows template 4 in place on circuit board 1 with a stencil 6 capable of contouring to match the surface of printed circuit board 1 as the board tolerances provide. Stencil 6 may be affixed to printed circuit board 1 in a variety of conventional manners: visually aligned and mechanically held, or vacuum held or the weight of the stencil itself (or with additional weights) may create sufficient contact to the printed circuit board itself. With stencil 6 aligned to and fixed in location on the surface of printed circuit board 1, low melting point solder paste is squeezed into the holes (not shown) of stencil 6 using conventional screen printing equipment such as those employing doctor blades.

With the solder paste confined within the walls of the template, thereby acting in effect as the dam or web of a conventional imaged solder mask for coarse pitch copper contacts, but which conventional mask cannot precisely contain solder paste for fine pitch contacts; stencil 6 is removed and printed circuit board 1 with template 4 in place is transferred to a reflow oven where the solder melts and conforms to the walls of the holes of the template. Upon removal from the reflow oven the template can either be removed from the circuit board or it can be permanently left in place depending upon the requirements of component connection. Some applications can use a solder deposit with the solder "bump" shape on its top surface, other applications may require flattening by any of several available processes. Such a flattening operation uses a flattening mechanical tool, for example, a press with a flat plate, prior to component attachment. The flat surface of the solder reduces the likelihood of lateral movement in the component interacting with the curved surface of the solder deposit.

There are those situations, for example with Tape Automated Bonding (TAB), where a Liquid Photo Imageable (LPI) resist solder mask is normally employed, where the LPI is unable to create a dam or web for the solder to isolate fine pitch features (less than 2 mil) on copper contacts. In one embodiment of this invention, a template will solve the problem by actually being a dam for the solder with no solder mask present and where existing solder resist technologies cannot define these features. In another embodiment, a method for controlling the volume of solder on select electrically conducting contacts of a substrate is disclosed. The template contains the solder deposit in the x, y and z directions within the approximate periphery of the pads and shapes the solder. The well created by the template in the absence of solder mask is filled with solder.

One advantage of use of the template is that it performs its function whether the substrate is a printed circuit board laminate or a ceramic hybrid circuit board, or wherever else solder is applied. While the invention is not especially sensitive to whether deposited solder originates as solder paste, solid solder, solder cream or solder powder; or even whether the means for depositing solder are screen printing, paste stencilling, jet printing, automatically dispensing solder paste, electroplating or by immersion in a molten solder bath; the preferred method is solder paste screen printing.

Rather than screen printing, paste printing employing a stencil provided at least equivalent performance without the need for as exact registration. With stencils, one can squeegee a relatively uniform thickness of paste over a large enough area to encompass a number of surface mount device (SMD) pads; these blocks of pads can be covered with solder as a unit. Such printed circuit boards and panels are usually only partially loaded with SMD pads.

There are those situations where a controlled high volume of solder is required on a specific site of a printed circuit board whether in the presence or absence of a solder mask. The template replaces the solder mask as a means for acting as an isolating barrier to contain molten solder and thereby shapes it to the particular configuration required by the components to be attached thereto. When the solder melts a near perfectly formed solid solder deposit is formed which shape is defined by the template's construction, geometry, sidewall, etc. Implicit in this, is the ability to form controlled high volume deposits in many other applications, such as: 40 mil high deposits used in mechanical connections, which are not soldered to; solder deposits which eliminate the need for solder preform; in pin-insertion applications; etc.

Similarly, there are those situations where the method used in the formation of a solder deposit by means of a template vary. With a template in place, one method is conventional using a stencil, paste printing, and reflowing the paste with the stencil in place with removal after reflow. Another is to control the volume of solder deposited on select conducting contacts of a substrate whereby the stencil is removed prior to solder reflow. There are thus different requirements dependent upon the nature of the component wherein a template greatly simplifies the deposition of solder and its shaping.

FIG. 5 is a process flow chart in block diagram form which is self-explanatory. As indicated, the template may be left on the board permanently or removed which latter would be the normal case. The last four steps are included to illustrate the total process but are not subject matter of this invention.

The refinements introduced by the present invention will become particularly valuable as the industry progresses to finer pitch contact patterns and denser component devices, for example, micro-Ball Grid Array ($\mu$BGA). The invention provides a procedure for depositing a controlled volume of solder on fine pitch patterns without complex plating or exotic molten solder dispensing equipment. Furthermore, the process enables controlled volumes of solder to be contained on select electrically conducting contacts of a substrate where high volumes or multi-tiered solder deposits may be desirable, for example, where a 0.0015 in. (1.5 mil) deposit on a bus bar site may be required adjacent to a 0.0020 in. (2.0 mil) deposit on conventional surface mount lands. By employing the template on the area where the conventional surface mount lands are located, multiple tiers of solder are formed during reflow and no shorts occur since the template also provides an isolating barrier. This is accomplished in a single paste printing step with a single thermal excursion.

Furthermore, the process is fully compatible with conventional SMT equipment and methods of operation as presently used to populate printed circuit boards. Lastly, the process allows for the manufacture of printed circuit boards relatively independent of the manufacturing processes by which components are attached.

Since the present invention is constituted as explained above, the meritorious effects of the preferred embodiment of this invention as enumerated below are readily achieved by use of a template to form solder deposits on fine pitch copper contacts as well as a method for controlling the volume of solder deposited.

1. There is no need to use a solder mask; the solder mask dam/web is replaced with the template.

2. There is no need to screen print twice.

3. Fine pitch registration problems are resolved.

4. On a printed circuit board or panel where multiple contact areas requiring different heights of solder are indicated, by using different template thicknesses one allows the formation of staggered solder deposits of varying heights and volumes.

5. Multiple thermal excursions may increase intermetallic growth which latter can preclude solder wetting at assembly. The instant invention by requiring only a single thermal excursion not only reduces this problem but also can extend shelf-life.

6. The integrity of the assembly in the field is improved by providing multiple solder volumes formed for specific component configurations.

7. Shapes the solder formed within the template so that the deposit has the configuration desired.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming simultaneously fine and coarse pitch solder deposits on a circuit board comprising the steps of:

registering a template with openings aligned to select circuit board fine pitch contacts;

positioning a stencil over the circuit board with openings aligned to select circuit board fine and coarse pitch contacts;

screen depositing solder paste into openings of the positioned stencil;

reflowing the solder paste while holding the positioned stencil against the circuit board to form solder on the select circuit board contacts; and releasing the stencil, after cooling, without removing the solder on the select circuit board contacts.

2. The method of claim 1 wherein the circuit board is selected from the group consisting of a circuit board, a hybrid circuit board and a semiconductor wafer.

3. A method for controlling the volume of solder deposited on select electrically conducting contacts of a substrate comprising the steps of:

registering a template having defined open contact pattern areas therein with defined contact pattern areas on the substrate;

positioning a stencil having openings aligned to the defined open contact pattern areas of the template in intimate contact with the uppermost surface of the template;

screen depositing solder paste into openings of the positioned stencil;

removing the stencil from the template;

reflowing the solder paste to form solder on the contacts to connect components thereto;

cooling; and removing the template.

4. The method of claim 3 wherein the template remains permanently on the substrate.

5. The method of claim 3 further comprising a plurality of templates.

* * * * *